(12) United States Patent
Shimoike et al.

(10) Patent No.: US 8,981,552 B2
(45) Date of Patent: Mar. 17, 2015

(54) POWER CONVERTER, SEMICONDUCTOR DEVICE, AND METHOD FOR MANUFACTURING POWER CONVERTER

(75) Inventors: Shoichiro Shimoike, Fukuoka (JP); Daisuke Yoshimi, Fukuoka (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 398 days.

(21) Appl. No.: 13/400,117

(22) Filed: Feb. 20, 2012

(65) Prior Publication Data

US 2012/0307541 A1  Dec. 6, 2012

(30) Foreign Application Priority Data

May 31, 2011  (JP) .................................. 2011-121499

(51) Int. Cl.
*H01L 23/053* (2006.01)
*H01L 23/049* (2006.01)
(Continued)

(52) U.S. Cl.
CPC ............ *H01L 23/049* (2013.01); *H01L 25/072* (2013.01); *H01L 24/92* (2013.01); *H01L 24/13* (2013.01); *H01L 24/16* (2013.01); *H01L 24/29* (2013.01); *H01L 24/32* (2013.01); *H01L 2224/73253* (2013.01); *H01L 2924/01013* (2013.01); *H01L 2924/01029* (2013.01); *H01L 2924/01033* (2013.01); *H01L 2924/0105* (2013.01); *H01L 2924/01079* (2013.01); *H01L 2924/13091* (2013.01); *H01L 2224/2919* (2013.01); *H01L 2924/01006* (2013.01); *H01L 2924/01023* (2013.01); *H01L 2924/01074* (2013.01); *H01L 2924/014* (2013.01); *H01L 2924/0665* (2013.01); *H01L 2224/29101* (2013.01); *H01L 2924/13055* (2013.01); *H01L 2224/16225* (2013.01); *H01L 2224/32225* (2013.01); *H01L 23/49811* (2013.01); *H01L 23/49844* (2013.01); *H01L 23/5385* (2013.01);
(Continued)

(58) Field of Classification Search
USPC ......... 257/536, 666, 675, 690, 692, 703, 704; 361/717, 721, 749, 760, 785; 363/37, 363/131, 144
See application file for complete search history.

(56) References Cited

U.S. PATENT DOCUMENTS 5,586,389 A  12/1996  Hirao et al.
6,060,772 A  5/2000  Sugawara et al.
(Continued)

FOREIGN PATENT DOCUMENTS

JP  11-074433  3/1999
JP  2005-532776  10/2005
JP  2010-098036  4/2010

OTHER PUBLICATIONS

Japanese Office Action for corresponding JP Application No. 2011-121499, Jun. 18, 2013.
(Continued)

*Primary Examiner* — Rajnikant Patel
(74) *Attorney, Agent, or Firm* — Mori & Ward, LLP

(57) ABSTRACT

This power converter includes a first substrate, a second substrate, a power conversion element, and a case portion, and the case portion includes a first connection terminal connected to a first conductor pattern arranged on a side of the first substrate closer to the power conversion element and a second connection terminal connected to a second conductor pattern arranged on a side of the second substrate opposite to the power conversion element.

20 Claims, 13 Drawing Sheets

(51) Int. Cl.
*H01L 25/07* (2006.01)
*H01L 23/00* (2006.01)
*H01L 23/498* (2006.01)
*H01L 23/538* (2006.01)

(52) U.S. Cl.
CPC ........... *H01L 2924/01322* (2013.01); *H01L 2224/13111* (2013.01); *H01L 2224/29111* (2013.01); *H01L 24/06* (2013.01); *H01L 24/73* (2013.01); *H01L 24/83* (2013.01); *H01L 2224/0401* (2013.01); *H01L 2224/04026* (2013.01); *H01L 2224/06181* (2013.01); *H01L 2224/16235* (2013.01); *H01L 2224/73204* (2013.01); *H01L 2224/83447* (2013.01); *H01L 2224/83815* (2013.01); *H01L 2224/92125* (2013.01); *H01L 2224/92225* (2013.01); *H01L 2924/3511* (2013.01)
USPC ............................................ 257/693; 257/704

(56) References Cited

U.S. PATENT DOCUMENTS

| | | | | |
|---|---|---|---|---|
| 6,448,645 | B1 * | 9/2002 | Kimura et al. | 257/735 |
| 6,885,096 | B2 * | 4/2005 | Hirahara et al. | 257/692 |
| 6,891,256 | B2 * | 5/2005 | Joshi et al. | 257/676 |
| 7,420,224 | B2 * | 9/2008 | Milich et al. | 257/177 |
| 7,456,492 | B2 * | 11/2008 | Mochida | 257/659 |
| 7,671,465 | B2 * | 3/2010 | Funakoshi et al. | 257/706 |
| 8,441,117 | B2 * | 5/2013 | Soyano | 257/693 |
| 8,461,623 | B2 * | 6/2013 | Nakata | 257/146 |
| 2011/0057713 | A1 | 3/2011 | Kawanami et al. | |

OTHER PUBLICATIONS

Partial European Search Report for corresponding EP Application No. 12156285.4-1552, Aug. 22, 2014.
Extended European Search Report for corresponding EP Application No. 12156285.4-1552, Dec. 8, 2014.

* cited by examiner

US 8,981,552 B2

POWER CONVERTER, SEMICONDUCTOR DEVICE, AND METHOD FOR MANUFACTURING POWER CONVERTER

CROSS-REFERENCE TO RELATED APPLICATIONS

The priority application number JP2011-121499, Power Converter, Semiconductor Device, and Method for Manufacturing Power Converter, May 31, 2011, Shoichiro Shimoike, Daisuke Yoshimi, upon which this patent application is based is hereby incorporated by reference.

BACKGROUND OF THE INVENTION

1. Field of the Invention

The present invention relates to a power converter, a semiconductor device, and a method for manufacturing a power converter.

2. Description of the Background Art

A power converter including a connection terminal is known in general.

Japanese Patent Laying-Open No. 2010-98036 discloses a semiconductor device (power converter) including an insulated substrate, semiconductor elements (power conversion elements such as IGBTs or power MOSFETs) mounted on a surface of the insulated substrate, and external connection terminals (connection terminals) electrically connected to main electrodes of the semiconductor elements. In this semiconductor device, the main electrodes of the semiconductor elements and the external connection terminals are electrically connected to each other through bonding wires extending in a horizontal direction.

SUMMARY OF THE INVENTION

A power converter according to a first aspect of the present invention includes a first substrate, a second substrate arranged to be opposed to the first substrate, a power conversion element mounted between the first substrate and the second substrate, and a case portion provided to surround the first substrate and the second substrate, while the case portion includes a first connection terminal connected to a first conductor pattern arranged on a side of the first substrate closer to the power conversion element and a second connection terminal connected to a second conductor pattern arranged on a side of the second substrate opposite to the power conversion element.

A semiconductor device according to a second aspect of the present invention includes a first substrate, a second substrate arranged to be opposed to the first substrate, a power conversion element mounted between the first substrate and the second substrate, and a case portion provided to surround the first substrate and the second substrate, while the case portion includes a first connection terminal connected to a first conductor pattern arranged on a side of the first substrate closer to the power conversion element and a second connection terminal connected to a second conductor pattern arranged on a side of the second substrate opposite to the power conversion element.

A method for manufacturing a power converter according to a third aspect of the present invention includes mounting a power conversion element between a first substrate and a second substrate, inserting the first substrate and the second substrate mounted with the power conversion element into a case portion from the second substrate and attaching the first substrate and the second substrate to the case portion, bonding a first connection terminal that the case portion has and a connection portion of a first conductor pattern arranged on the first substrate to each other, and bonding a second connection terminal that the case portion has and a connection portion of a second conductor pattern arranged on the second substrate to each other.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

(First Embodiment)

Figure 1:
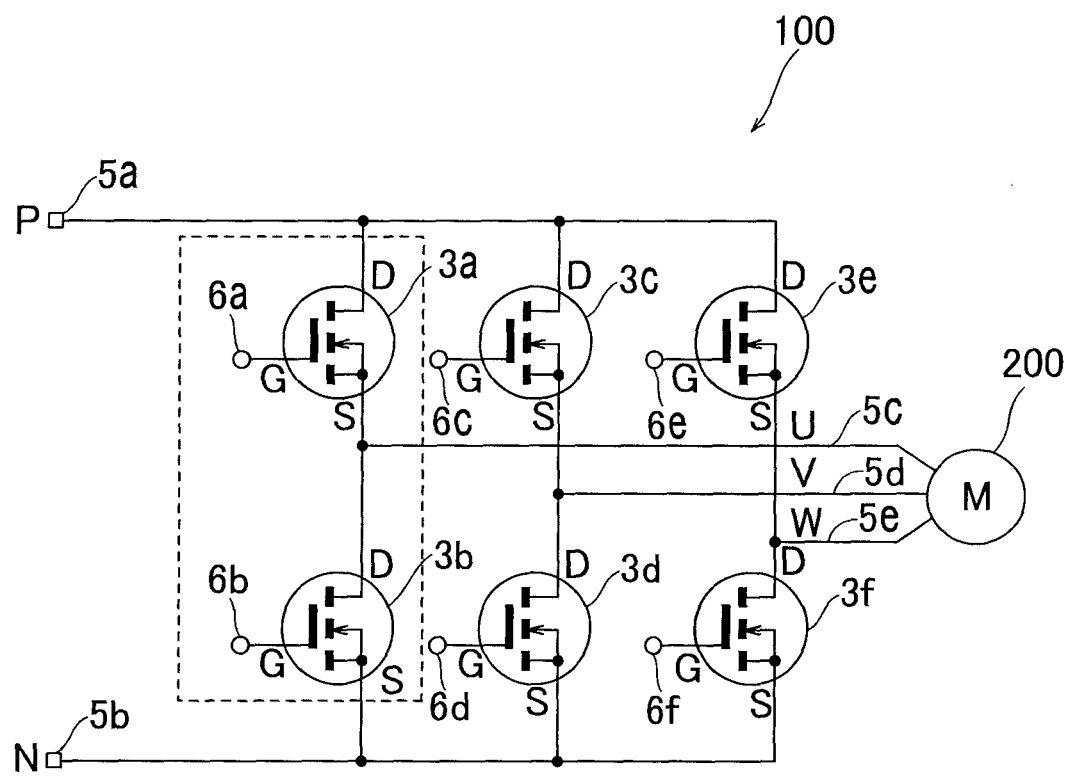
FIG. 1 is a circuit diagram of a power module according to a first embodiment of the present invention.

As shown in a circuit diagram in FIG. 1, a power module 100 according to a first embodiment of the present invention constitutes a three-phase inverter circuit connected to a motor 200 or the like. The power module 100 includes six MOSFETs 3a to 3f. Here, the MOSFETs 3a to 3f denote n-type field effect transistors. The power module 100 is an example of the "power converter" and the "semiconductor device" in the present invention. The MOSFETs 3a, 3c, and 3e constitute the upper arm of the power module 100, and are examples of the "power conversion element" and the "first power conversion element" in the present invention. The MOSFETs 3b, 3d, and 3f constitute the lower arm of the power module 100, and are examples of the "power conversion element" and the "second power conversion element" in the present invention.

The drains (D) of the MOSFETs 3a, 3c, and 3e are connected to a P-side connection terminal 5a. The source (S) of the MOSFET 3b is connected to an N-side connection terminal 5b. The source (S) of the MOSFET 3d is connected to the N-side connection terminal 5b. The source (S) of the MOSFET 3f is connected to the N-side connection terminal 5b. The source (S) of the MOSFET 3a and the drain (D) of the MOSFET 3b are connected to a U-phase connection terminal 5c of a power source of the motor 200. The source (S) of the MOSFET 3c and the drain (D) of the MOSFET 3d are connected to a V-phase connection terminal 5d of the power source of the motor 200. The source (S) of the MOSFET 3e and the drain (D) of the MOSFET 3f are connected to a W-phase connection terminal 5e of the power source of the motor 200.

The structure of the power module 100 is now described with reference to FIGS. 2 to 5. Here, the cross-section structure (see FIGS. 3 and 4) of a portion (portion surrounded by a broken line in FIG. 1) of the power module 100 constituting the upper arm and the lower arm of a U-phase is mainly described. The cross-section structure of portions of the power module 100 constituting the upper arms and the lower arms of a V-phase and a W-phase is similar to that of the U-phase, and hence the description is omitted.

Figure 2:
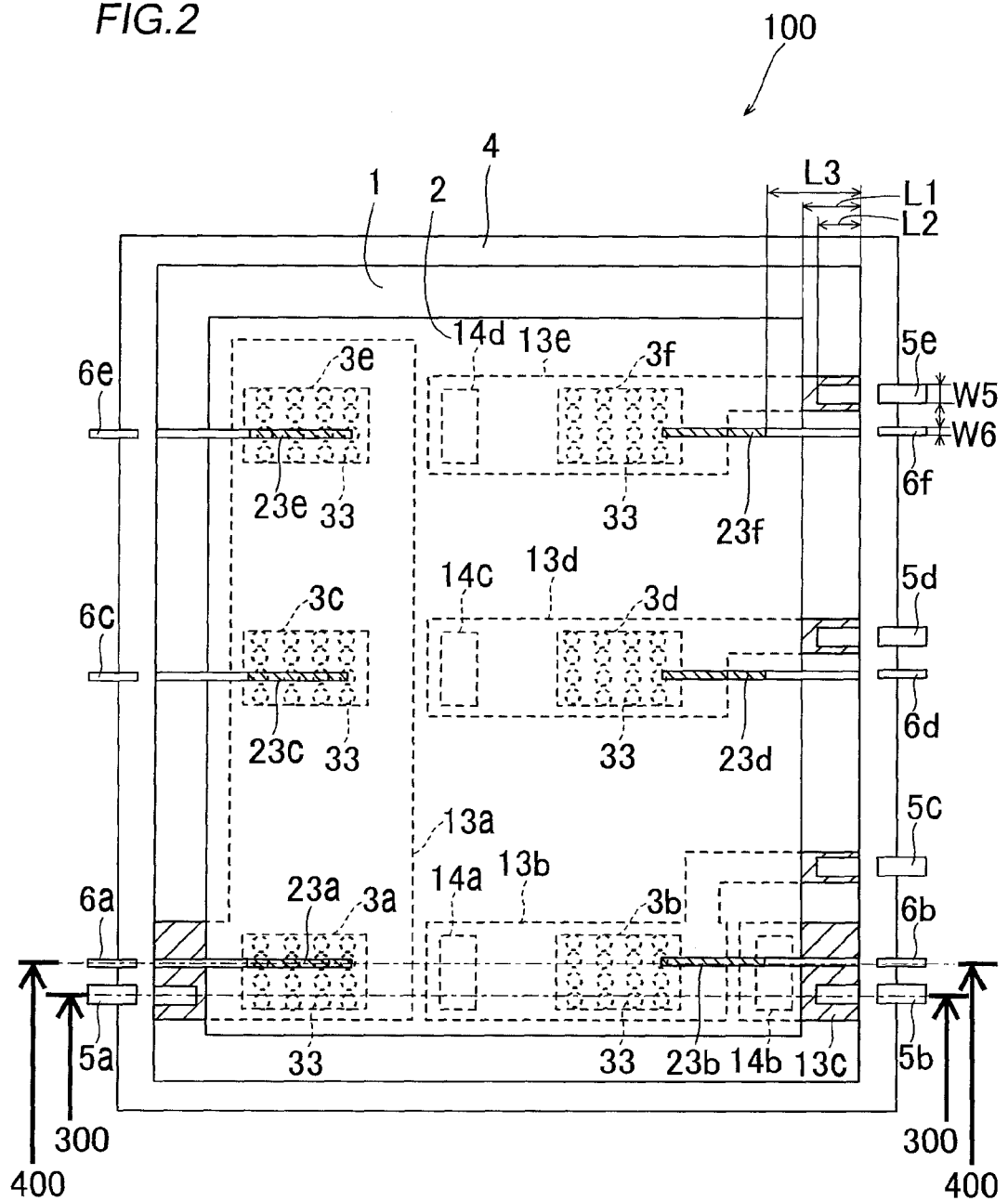
FIG. 2 is a plan view of the power module according to the first embodiment of the present invention.
Figure 3:
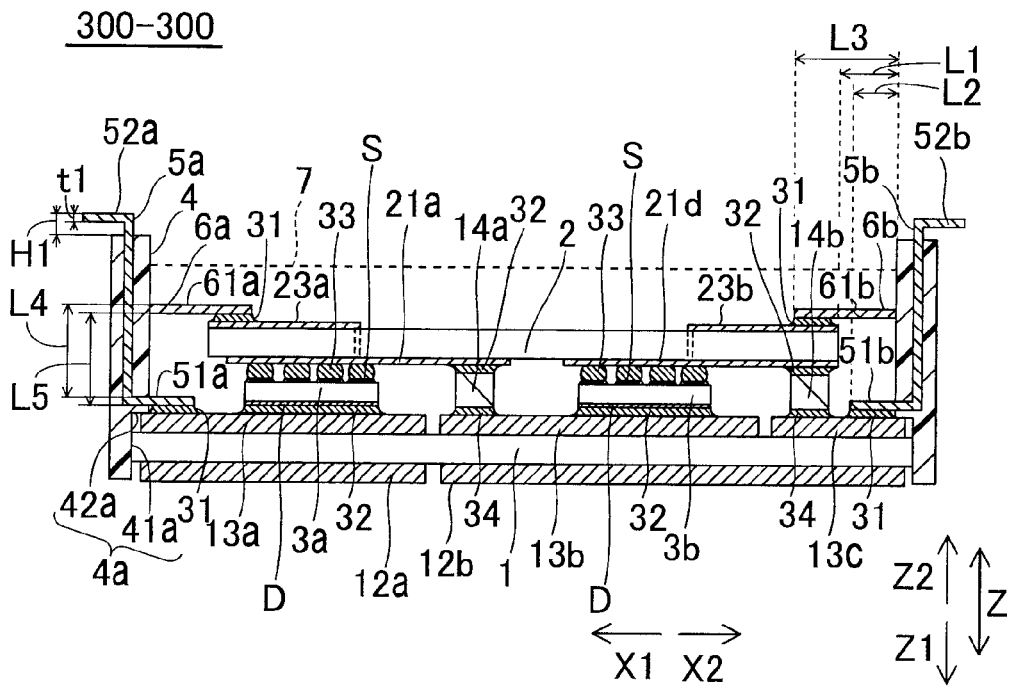
FIG. 3 is a sectional view taken along the line 300-300 in FIG. 2.
Figure 4:
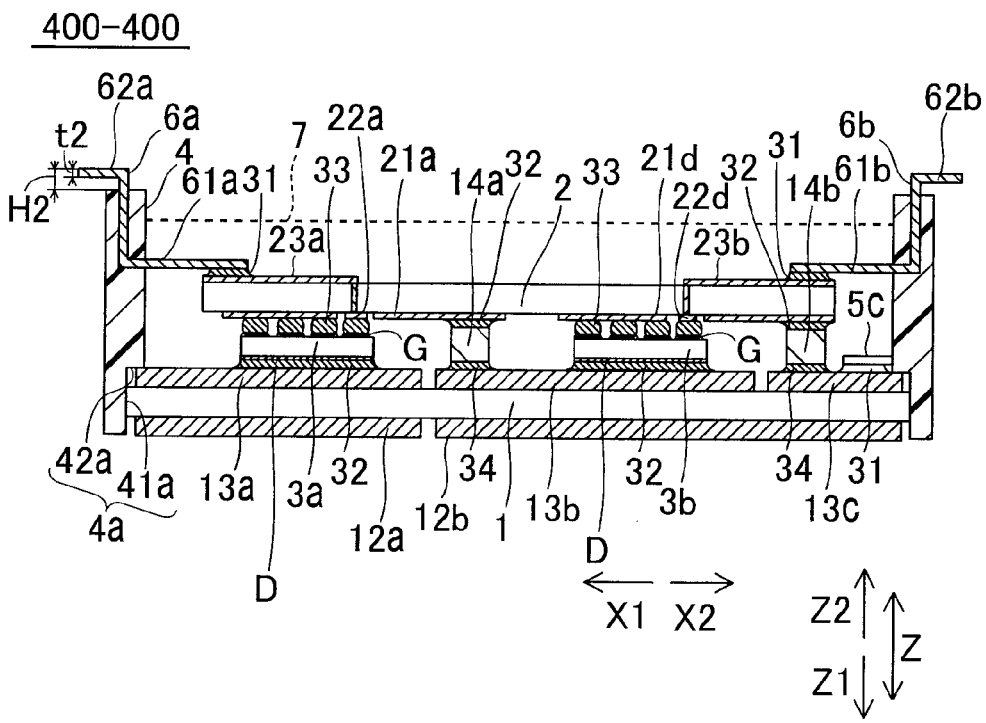
FIG. 4 is a sectional view taken along the line 400-400 in FIG. 2.

As shown in FIGS. 2 to 4, a first substrate 1 and a second substrate 2 are arranged in a case portion 4. As shown in FIGS. 3 and 4, the first substrate 1 located on a lower side and the second substrate 2 located on an upper side are arranged in the case portion 4 while the same are opposed to each other in a direction Z (in a vertical direction). The first substrate 1 and the second substrate 2 are based on an insulating material such as ceramic. According to the first embodiment, the area of the second substrate 2 located on the upper side is smaller than the area of the first substrate 1 located on the lower side. Specifically, the width W1 in a direction X and the width W2 in a direction Y (see FIG. 7) of the second substrate 2 located on the upper side are smaller than the width W3 in the direction X and the width W4 in the direction Y (see FIG. 5) of the first substrate 1 located on the lower side, respectively. Thus, the second substrate 2 located on the upper side can penetrate upward without interfering with the P-side connection terminal 5a (51a) and the N-side connection terminal 5b (51b) (see FIG. 3) protruding toward the first substrate 1 from the inner surface of the case portion 4 when the first substrate 1 and the second substrate 2 are inserted into the case portion 4 from below.

Radiator plates 12a and 12b are formed on the lower surface (in a direction Z1) of the first substrate 1 located on the lower side. The radiator plates 12a and 12b are made of copper foil or aluminum foil, for example, and each have a thickness of at least about 100 µm and not more than about 500 µm. The radiator plate 12a overlaps with a conductive pattern 13a described later provided on the upper surface of the first substrate 1 in plan view (in a direction X-Y), and is substantially opposed to the conductive pattern 13a through the first substrate 1. The radiator plate 12b overlaps with a conductive pattern 13b (MOSFET 3b) and a conductive pattern 13c in plan view (in the direction X-Y), and is substantially opposed to the conductive pattern 13b and the conductive pattern 13c through the first substrate 1. In other words, the radiator plates 12a and 12b are provided symmetrically with the conductive patterns 13a to 13c through the first substrate 1. Thus, the warpage of the first substrate 1 that may be generated by stress resulting from a heating and cooling cycle in solder bonding or in operation can be inhibited. The radiator plate 12a is an example of the "first radiator plate" in the present invention. The radiator plate 12b is an example of the "second radiator plate" in the present invention.

The conductive patterns 13a, 13b, and 13c are provided on the upper surface (in a direction Z2) of the first substrate 1 located on the lower side. The conductive patterns 13a to 13c are made of copper foil, for example, and each have a thickness of at least about 100 µm and not more than about 500 µm. The conductive patterns 13a to 13c each have a thickness equal to those of the radiator plates 12a and 12b, whereby the warpage of the first substrate 1 that may be generated by stress resulting from a heating and cooling cycle can be inhibited. According to the first embodiment, the conductive pattern 13a is so formed that a portion 131a thereof (see FIG. 5) on an end in a direction X1 is connected to the P-side connection terminal 5a. The conductive pattern 13b is so formed that a portion 131b thereof (see FIG. 5) on an end in a direction X2 is connected to the U-phase connection terminal 5c (see FIG. 4). The conductive pattern 13c is so formed that a portion 131c thereof (see FIG. 5) on an end in the direction X2 is connected to the N-side connection terminal 5b. In other words, the portions 131a to 131c connected to the connection terminals are provided on edges of the first substrate 1 located on the lower side. The conductive patterns 13a to 13c are examples of the "first conductor pattern" in the present invention. The portions 131a to 131c connected to the connection terminals are examples of the "connection portion" in the present invention.

Conductive patterns 21a and 21d are formed on the lower surface (in the direction Z1) of the second substrate 2 located on the upper side. As shown in FIG. 4, a conductive pattern 22a (22d) is formed on a portion corresponding to the gate (G) of the MOSFET 3a (3b). Conductive patterns 23a and 23b are formed on the upper surface (in the direction Z2) of the second substrate 2 located on the upper side. The conductive patterns 23a and 23b are examples of the "second conductor pattern" in the present invention. According to the first embodiment, a gate connection terminal 6a (6b) provided in the case portion 4 is electrically connected to the gate (G) of the MOSFET 3a (3b) through the conductive pattern 23a (23b) and the conductive pattern 22a (22d). The conductive patterns 23a and 23b are so formed that portions 231a and 231b (see FIG. 8) where the conductive patterns 23a and 23b are connected to the gate connection terminals 6a and 6b are arranged in the vicinity of ends (edges) of the second substrate 2 located on the upper side. The portions 231a and 231b connected to the gate connection terminals are examples of the "connection portion" in the present invention.

As shown in FIG. 3, the drain (D) of the MOSFET 3a is mounted on a surface of the conductive pattern 13a of the first substrate 1 located on the lower side through a lower melting solder layer 32. The lower melting solder layer 32 is made of Sn-37Pb having a melting temperature of 183° C., for example. The source (S) of the MOSFET 3a is connected to the conductive pattern 21a of the second substrate 2 located on the upper side through solder balls 33. The solder balls 33 are made of Sn-3Ag-0.5Cu having a melting temperature of 217° C., for example. The source (S) of the MOSFET 3a and the conductive pattern 21a of the second substrate 2 located on the upper side are connected to each other by the fifteen solder balls 33 (see FIG. 2).

As shown in FIG. 3, a columnar conductive member 14a is mounted on a surface of the conductive pattern 13b of the first substrate 1 located on the lower side through a higher melting solder layer 34. The higher melting solder layer 34 is made of Sn-3Ag-0.5Cu having a melting temperature of 217° C., for example. The conductive member 14a is connected to the conductive pattern 21a of the second substrate 2 through a lower melting solder layer 32. The drain (D) of the MOSFET 3b is mounted on a surface of the conductive pattern 13b through a lower melting solder layer 32. The source (S) of the MOSFET 3b is connected to the conductive pattern 21d of the second substrate 2 located on the upper side through solder balls 33.

As shown in FIG. 3, a columnar conductive member 14b is mounted on a surface of the conductive pattern 13c of the first substrate 1 located on the lower side through a higher melting solder layer 34. The conductive member 14b is connected to the conductive pattern 21d of the second substrate 2 located on the upper side through a lower melting solder layer 32.

The case portion 4 is provided to surround the first substrate 1 and the second substrate 2, as shown in FIG. 2. The case portion 4 is formed in the form of a frame in plan view (in the direction X-Y). According to the first embodiment, the metallic P-side connection terminal 5a and the metallic N-side connection terminal 5b connected to the conductive patterns 13a and 13c provided on the first substrate 1 are so provided as to be embedded in the case portion 4 made of resin. Furthermore, the gate connection terminals 6a and 6b connected to the conductive patterns 23a and 23b provided on the second substrate 2 are so provided as to be embedded in the case portion 4. The P-side connection terminal 5a and the N-side connection terminal 5b are formed to supply principal currents (currents for power) to the source (S) of the MOSFET 3a and the drain (D) of the MOSFET 3b. The gate connection terminals 6a and 6b are formed to supply control signals (currents for control signals) for turning on/off the MOSFETs to the gates (G) of the MOSFETs 3a and 3b. The P-side connection terminal 5a and the N-side connection terminal 5b are examples of the "first connection terminal" in the present invention. The gate connection terminals 6a and 6b are examples of the "second connection terminal" in the present invention.

As shown in FIG. 3, the first end 51a of the P-side connection terminal 5a is so formed as to protrude toward the first substrate 1 located on the lower side from the inner surface of the case portion 4. A second end 52a of the P-side connection terminal 5a is so formed as to bend substantially at 90° and extend in a direction that is away from the side of the first substrate 1 (in the direction X1, toward the outer periphery of the case portion 4) after protruding in the direction Z2 from the upper surface of the case portion 4. A portion of the P-side connection terminal 5a other than the first end 51a and the second end 52a is embedded in the case portion 4. The first end 51a of the P-side connection terminal 5a is connected to the conductive pattern 13a through a solder layer 31 when the first substrate 1 is arranged in the case portion 4.

As shown in FIG. 4, a first end 61a of the gate connection terminal 6a is so formed as to protrude toward the second substrate 2 located on the upper side from the inner surface of the case portion 4. A second end 62a of the gate connection terminal 6a is so formed as to bend substantially at 90° and extend in a direction that is away from the side of the second substrate 2 (in the direction X1, toward the outer periphery of the case portion 4) after protruding in the direction Z2 from the upper surface of the case portion 4. A portion of the gate connection terminal 6a other than the first end 61a and the second end 62a is embedded in the case portion 4. The first end 61a of the gate connection terminal 6a is connected to the conductive pattern 23a through a solder layer 31 when the second substrate 2 is arranged in the case portion 4.

According to the first embodiment, the power module 100 is so formed that protrusion lengths L2 of portions of the P-side connection terminal 5a and the N-side connection terminal 5b protruding toward the first substrate 1 from the inner surface of the case portion 4 are smaller than a length L1 from the outer peripheral end of the second substrate 2 to the inner surface of the case portion 4, as shown in FIG. 3 (L2<L1). Thus, the P-side connection terminal 5a and the N-side connection terminal 5b can be prevented from intruding into a region where the first substrate 1 and the second substrate 2 are opposed to each other when the MOSFETs are mounted between the first substrate 1 and the second substrate 2.

According to the first embodiment, the power module 100 is so formed that the protrusion length L2 of the portion of the P-side connection terminal 5a protruding toward the first substrate 1 from the inner surface of the case portion 4 is smaller than protrusion lengths L3 of portions of the gate connection terminals 6a and 6b protruding toward the second substrate 2 from the inner surface of the case portion 4. A difference between the vertical position of the first end 51a of the P-side connection terminal 5a (N-side connection terminal 5b) and the vertical position of the first end 61a of the gate connection terminal 6a (gate connection terminal 6b) is L4. A difference between the vertical position of a portion (surface of the solder layer 31) of the first substrate 1 connected with the P-side connection terminal 5a (N-side connection terminal 5b) and the vertical position of a portion (surface of the solder layer 31) of the second substrate 2 connected with the gate connection terminal 6a (6b) is L5. At this time, L4 and L5 are substantially equal to each other. In other words, when the P-side connection terminal 5a (N-side connection terminal 5b) comes into contact with the solder layer 31 of the first substrate 1, the gate connection terminal 6a (gate connection terminal 6b) also comes into contact with the solder layer 31 of the second substrate 2.

As shown in FIG. 2, the P-side connection terminal 5a and the N-side connection terminal 5b and the gate connection terminals 6a and 6b are deviated not to overlap with each other in plan view (in the direction X-Y). The width W5 of the P-side connection terminal 5a (N-side connection terminal 5b) is larger than the width W6 of the gate connection terminal 6a (6b) in plan view (in the direction X-Y) (W5>W6). As shown in FIGS. 3 and 4, the thickness t1 of the P-side connection terminal 5a (N-side connection terminal 5b) is substantially equal to the thickness t2 of the gate connection terminal 6a (6b). In other words, according to the first embodiment, the sectional areas of the P-side connection terminal 5a and the N-side connection terminal 5b in which principal currents flow are larger than the sectional areas of the gate connection terminals 6a and 6b in which control signals flow. The sectional area of each connection terminal is set depending on the magnitude of currents flowing in each connection terminal.

As shown in FIGS. 3 and 4, the vertical position of the second end 52a (52b) of the P-side connection terminal 5a (N-side connection terminal 5b) and the vertical position of the second end 62a (62b) of the gate connection terminal 6a (gate connection terminal 6b) are substantially equal to each other. In other words, the protrusion height H1 (see FIG. 3) of the second end 52a (52b) of the P-side connection terminal 5a (N-side connection terminal 5b) from the upper surface of the case portion 4 and the protrusion height H2 (see FIG. 4) of the second end 62a (62b) of the gate connection terminal 6a (6b) from the upper surface of the case portion 4 are substantially equal to each other.

According to the first embodiment, the outer side surface of the first substrate 1 located on the lower side and the upper surfaces of the conductive patterns 13a and 13c come into contact with a lower portion (end surface in the direction Z1) of the case portion 4 when the first substrate 1 and the second substrate 2 are inserted into the case portion 4, whereby a reverse L-shaped positioning portion 4a (see FIGS. 3 and 4) to position the first substrate 1 located on the lower side is provided on the lower portion of the case portion 4. Specifically, the positioning portion 4a includes a lateral positioning portion 41a to position the outer side surface of the first substrate 1 and a vertical positioning portion 42a coming into contact with the upper surfaces of the conductive patterns 13a and 13c. This positioning portion 4a is circumferentially provided on the lower portion of the frame-shaped case portion 4.

According to the first embodiment, a sealing member 7 is filled into the case portion 4 to cover the first substrate 1, the second substrate 2, and the MOSFETs 3a and 3b and expose the second end 52a (52b) of the P-side connection terminal 5a (N-side connection terminal 5b) and the second end 62a (62b) of the gate connection terminal 6a (6b). The sealing member 7 is made of an insulating member such as liquid epoxy resin.

The planar structure of the U-phase, the V-phase, and the W-phase of the power module 100 is now described with reference to FIGS. 2 and 5 to 8.

Figure 5:
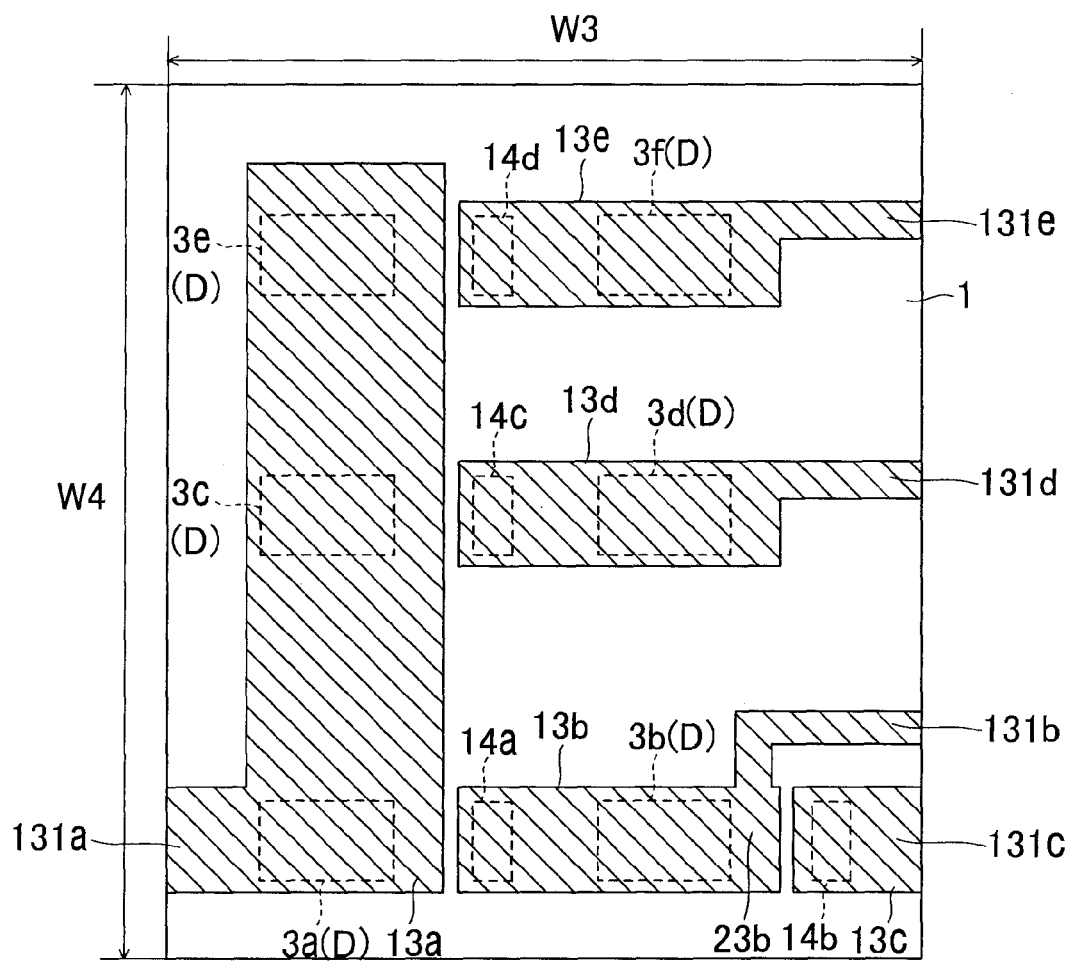
FIG. 5 is a top plan view of a first substrate of the power module according to the first embodiment of the present invention.

As shown in FIG. 5, conductive patterns 13a, 13b, 13c, 13d, and 13e are provided on the upper surface (in the direction Z2) of the first substrate 1 located on the lower side. The conductive pattern 13a is electrically connected to the drains (D) of the MOSFETs 3a, 3c, and 3e. The conductive pattern 13b is electrically connected to the columnar conductive member 14a and the drain (D) of the MOSFET 3b. The conductive pattern 13c is electrically connected to the columnar conductive member 14b (see FIG. 2). The conductive pattern 13d is electrically connected to a columnar conductive member 14c and the drain (D) of the MOSFET 3d. The conductive pattern 13d is so formed that a portion 131d thereof on an end in the direction X2 is connected to the V-phase connection terminal 5d (see FIG. 2). The conductive pattern 13e is electrically connected to a columnar conductive member 14d and the drain (D) of the MOSFET 3f. The conductive pattern 13e is so formed that a portion 131e thereof on an end in the direction X2 is connected to the W-phase connection terminal 5e (see FIG. 2). The conductive patterns 13d and 13e are examples of the "first conductor pattern" in the present invention. The portions 131d and 131e are examples of the "connection portion" in the present invention.

Figure 6:
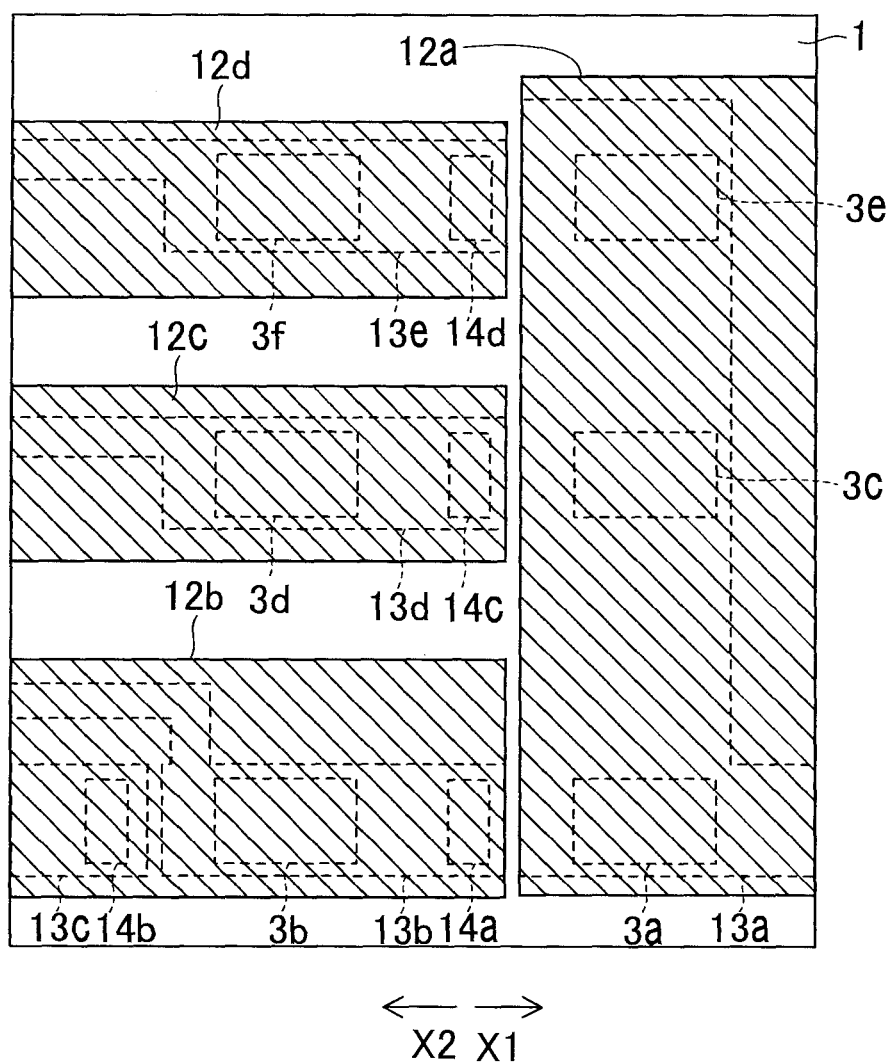
FIG. 6 is a bottom plan view of the first substrate of the power module according to the first embodiment of the present invention.

As shown in FIG. 6, radiator plates 12a to 12d are formed on the lower surface (in the direction Z1, see FIG. 3) of the first substrate 1 located on the lower side. The radiator plate 12c is provided to overlap with the conductive pattern 13d (MOSFET 3d) in plan view (in the direction X-Y). The radiator plate 12d is provided to overlap with the conductive pattern 13e (MOSFET 3f) in plan view (in the direction X-Y). The radiator plates 12c and 12d are examples of the "second radiator plate" in the present invention.

Figure 7:
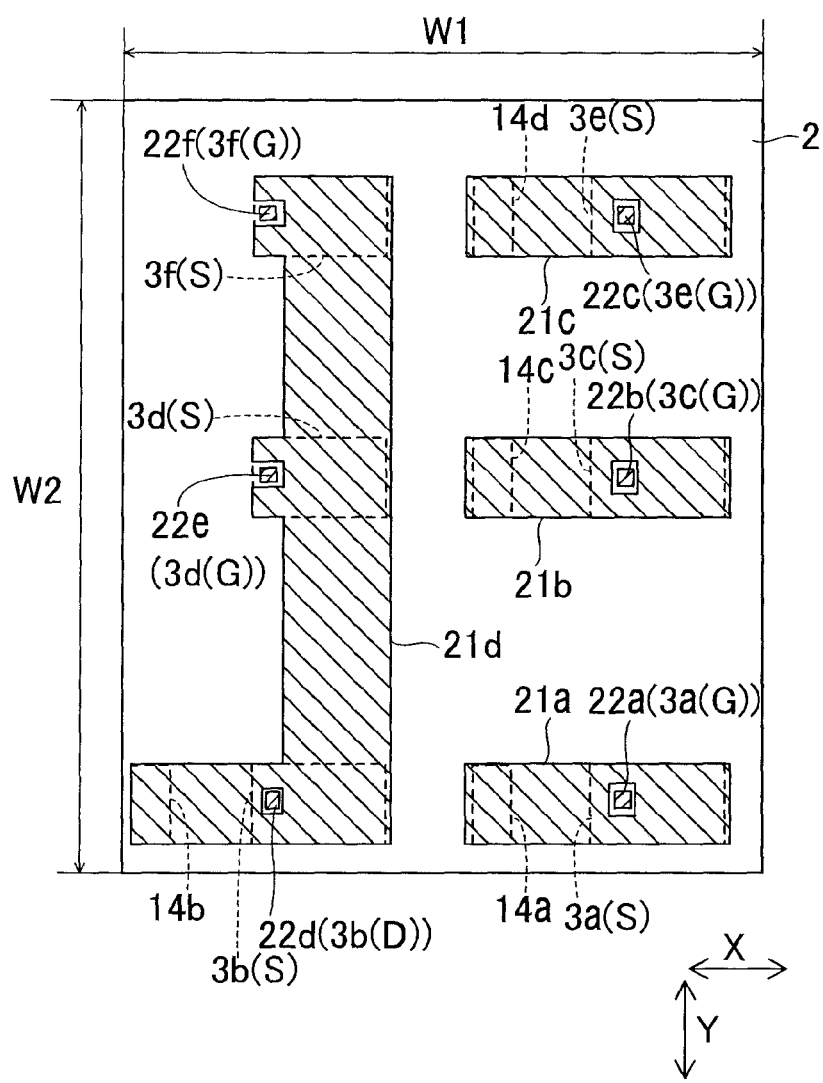
FIG. 7 is a bottom plan view of a second substrate of the power module according to the first embodiment of the present invention.

As shown in FIG. 7, conductive patterns 21a, 21b, 21c, and 21d are formed on the lower surface (in the direction Z1) of the second substrate 2 located on the upper side. The conductive pattern 21a is formed to electrically connect the source (S) of the MOSFET 3a and the conductive member 14a. The conductive pattern 22a to electrically connect the gate (G) of the MOSFET 3a and the gate connection terminal 6a (see FIG. 2) is provided to be surrounded by the conductive pattern 21a. The conductive pattern 21b is formed to electrically connect the source (S) of the MOSFET 3c and the conductive member 14c. A conductive pattern 22b to electrically connect the gate (G) of the MOSFET 3c and a gate connection terminal 6c (see FIG. 2) is provided to be surrounded by the conductive pattern 21b. The conductive pattern 21c is formed to electrically connect the source (S) of the MOSFET 3e and the conductive member 14d. A conductive pattern 22c to electrically connect the gate (G) of the MOSFET 3e and a gate connection terminal 6e (see FIG. 2) is provided to be surrounded by the conductive pattern 21c.

The conductive pattern 21d is formed to electrically connect the sources (S) of the MOSFETs 3b, 3d, and 3f and the conductive member 14b. A conductive pattern 22d to electrically connect the gate (G) of the MOSFET 3b and the gate connection terminal 6b (see FIG. 2) is provided to be surrounded by the conductive pattern 21d. A conductive pattern 22e to electrically connect the gate (G) of the MOSFET 3d and a gate connection terminal 6d (see FIG. 2) is formed in the vicinity of the conductive pattern 21d. A conductive pattern 22f to electrically connect the gate (G) of the MOSFET 3f and a gate connection terminal 6f (see FIG. 2) is formed in the vicinity of the conductive pattern 21d.

Figure 8:
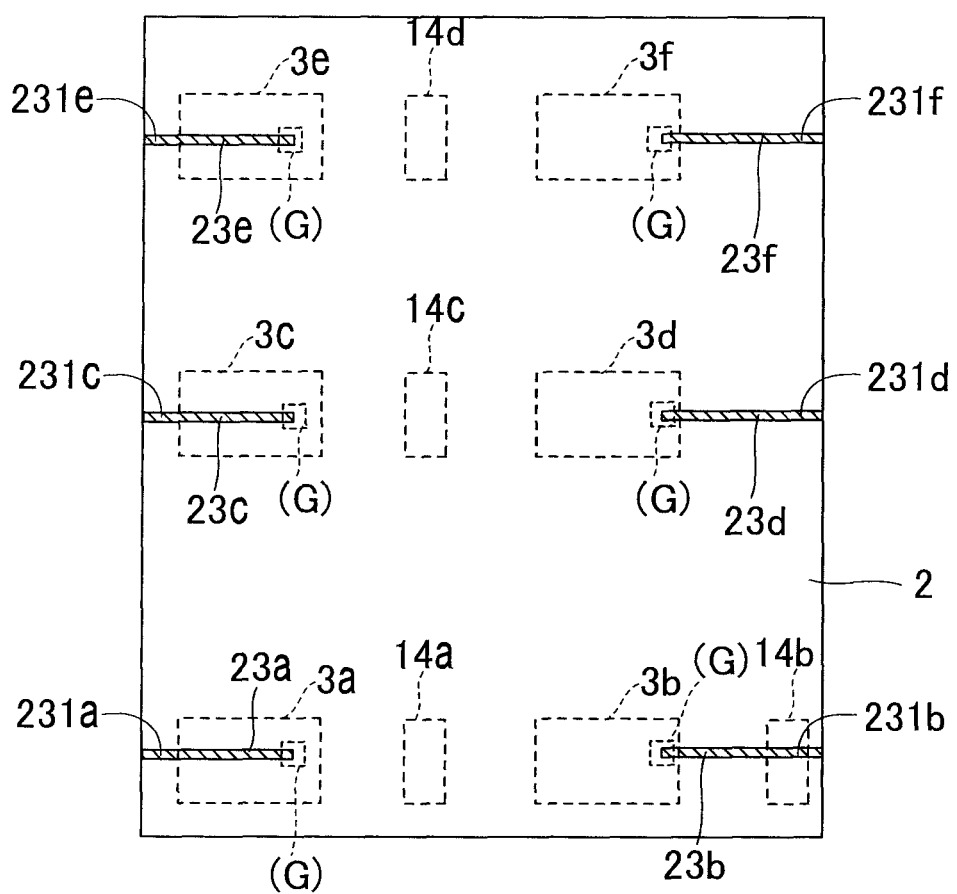
FIG. 8 is a top plan view of the second substrate of the power module according to the first embodiment of the present invention.

As shown in FIG. 8, conductive patterns 23a, 23b, 23c, 23d, 23e, and 23f are formed on the upper surface (in the direction Z2) of the second substrate 2 located on the upper side. The conductive patterns 23a to 23f are examples of the "second conductor pattern" in the present invention. The gate connection terminals 6a to 6f (see FIG. 2) provided in the case portion 4 are electrically connected to the gates (G) of the MOSFETs 3a to 3f, respectively, through the conductive patterns 23a to 23f and the conductive patterns 22a to 22f (see FIG. 7). The conductive patterns 23a to 23f are so formed that portions 231a, 231b, 231c, 231d, 231e, and 231f where the conductive patterns 23a to 23f are connected to the gate connection terminals 6a to 6f are arranged in the vicinity of ends (edges) of the second substrate 2. The portions 231a to 231f are examples of the "connection portion" in the present invention.

As shown in FIG. 2, the P-side connection terminal 5a, the N-side connection terminal 5b, the U-phase connection terminal 5c, the V-phase connection terminal 5d, and the W-phase connection terminal 5e connected to the conductive patterns 13a to 13e provided on the first substrate 1 are provided to be embedded in the case portion 4. Furthermore, the gate connection terminals 6a to 6f connected to the conductive patterns 23a to 23f provided on the second substrate 2 are provided to be embedded in the case portion 4. The P-side connection terminal 5a, the N-side connection terminal 5b, the U-phase connection terminal 5c, the V-phase connection terminal 5d, and the W-phase connection terminal 5e are formed to supply principal currents to the sources (S) or the drains (D) of the MOSFETs 3a to 3f. The gate connection terminals 6a to 6f are formed to supply control signals for turning on/off the MOSFETs to the gates (G) of the MOSFETs 3a to 3f. The P-side connection terminal 5a, the N-side connection terminal 5b, the U-phase connection terminal 5c, the V-phase connection terminal 5d, and the W-phase connection terminal 5e are examples of the "first connection terminal" in the present invention. The gate connection terminals 6a to 6f are examples of the "second connection terminal" in the present invention.

A method for manufacturing the power module 100 according to the first embodiment is now described with reference to FIGS. 3 and 9 to 17. FIGS. 3 and 9 to 17 show a portion of the power module 100 constituting the upper arm and the lower arm of the U-phase, and the arms of the V-phase and the W-phase are also formed simultaneously with that of the U-phase.

Figure 9:
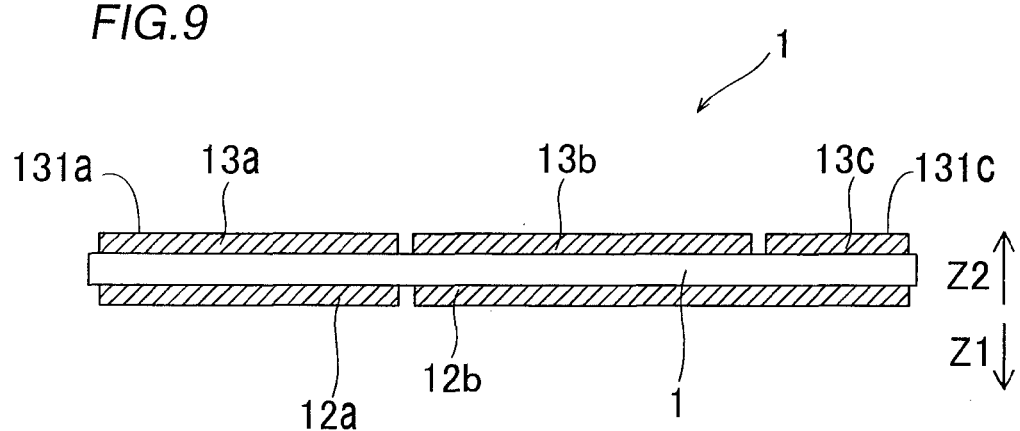
FIG. 9 is a diagram for illustrating a step of forming a conductive pattern on the first substrate of the power module according to the first embodiment of the present invention.

As shown in FIG. 9, the first substrate 1 having the conductive patterns 13a to 13e made of copper foil formed on the surface in the direction Z2 (upper surface) and the radiator plates 12a to 12d made of copper foil or aluminum foil formed on the surface in the direction Z1 (lower surface) is prepared.

Figure 10:
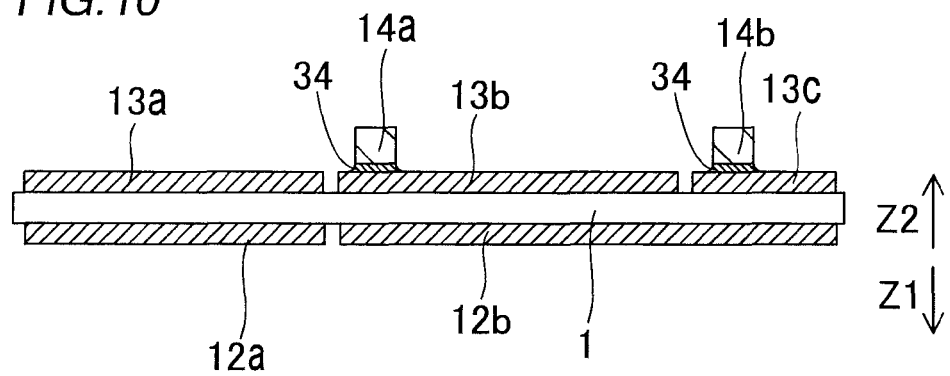
FIG. 10 is a diagram for illustrating a step of mounting a conductive member on the conductive pattern of the first substrate of the power module according to the first embodiment of the present invention.

As shown in FIG. 10, the conductive members 14a and 14b are mounted on the surfaces of the conductive patterns 13b and 13c, respectively, by the higher melting solder layers 34 made of Sn-3Ag-0.5Cu having a melting temperature of 217° C. Similarly, the conductive members 14c and 14d are mounted on surfaces of the conductive patterns 13d and 13e, respectively, by higher melting solder layers 34.

Figure 11:
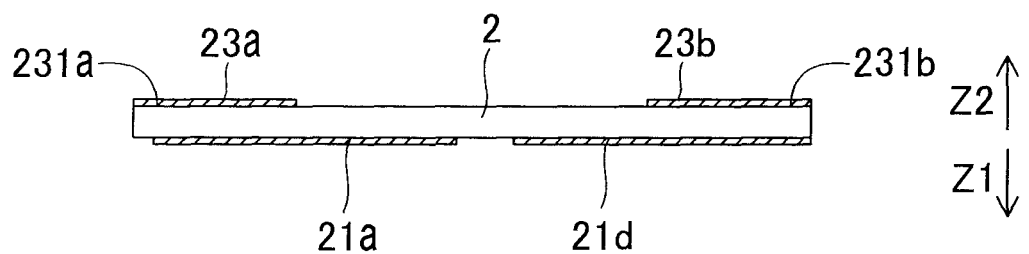
FIG. 11 is a diagram for illustrating a step of forming a conductive pattern on the second substrate of the power module according to the first embodiment of the present invention.

As shown in FIG. 11, the second substrate 2 having the conductive patterns 21a to 21d and the conductive patterns 22a to 22f (see FIG. 7) made of copper foil formed on the surface in the direction Z1 (lower surface) and the conductive patterns 23a to 23f made of copper foil formed on the surface in the direction Z2 (upper surface) is prepared.

Figure 12:
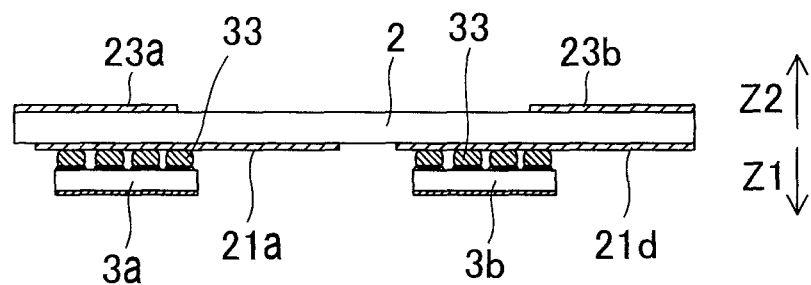
FIG. 12 is a diagram for illustrating a step of mounting a MOSFET on the conductive pattern of the second substrate of the power module according to the first embodiment of the present invention.

As shown in FIG. 12, the sources (S) of the MOSFETs 3a, 3c, and 3e are mounted to the conductive patterns 21a, 21b, and 21c, respectively, by solder balls 33 made of Sn-3Ag-0.5Cu having a melting temperature of 217° C., for example. The gates (G) of the MOSFETs 3a, 3c, and 3e are mounted to the conductive patterns 22a, 22b, and 22c (see FIG. 7), respectively, by the solder balls 33. The sources (S) of the MOSFETs 3b, 3d, and 3f are mounted to the conductive pattern 21d by solder balls 33. The gates (G) of the MOSFETs 3b, 3d, and 3f are mounted to the conductive patterns 22d, 22e, and 22f (see FIG. 7), respectively, by the solder balls 33.

Underfill resin may be filled into clearances between the MOSFETs 3a to 3f and the conductive patterns 21a to 21d when the MOSFETs 3a to 3f are mounted to the conductive patterns 21a to 21d. Consequently, short circuits to the MOSFETs 3a to 3f and the conductive patterns 21a to 21d can be inhibited. Furthermore, the influence (stress) of differences between the thermal expansion coefficients of the MOSFETs 3a to 3f and the thermal expansion coefficient of the second substrate 2 on the solder balls 33 is reduced, and the solder balls 33 and the MOSFETs 3a to 3f (conductive patterns 21a to 21d) that are bonded to each other can be inhibited from separation.

Figure 13:
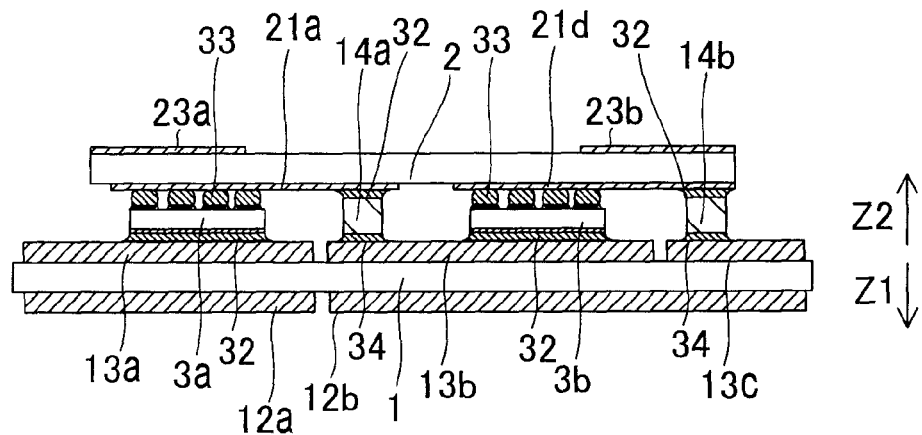
FIG. 13 is a diagram for illustrating a step of stacking the first substrate and the second substrate of the power module according to the first embodiment of the present invention.

As shown in FIG. 13, the MOSFETs 3a to 3f are mounted between the first substrate 1 located on the lower side and the second substrate 2 located on the upper side. Specifically, the drains (D) of the MOSFETs 3a, 3c, and 3e are mounted to the conductive pattern 13a by lower melting solder layers 32 made of Sn-37Pb having a melting temperature of 183° C., for example while the first substrate 1 located on the lower side and the second substrate 2 located on the upper side are opposed to each other. The drains (D) of the MOSFETs 3b, 3d, and 3f are mounted to the conductive patterns 13b, 13d, and 13e, respectively, by lower melting solder layers 32. The conductive members 14a and 14b (14c, 14d) are mounted to the conductive patterns 21a and 21d (21b, 21c) by the lower melting solder layers 32. A reflow process may be performed to mount the MOSFETs 3a to 3f to the conductive patterns 13a to 13e at once after arranging solder sheets in place of the lower melting solder layers 32 and overlapping the second substrate 2 located on the upper side with the first substrate 1 located on the lower side. Thus, the MOSFETs 3a to 3f can be easily mounted to the conductive patterns 13a to 13e. Bonding by solder having a relatively high melting temperature (solder balls 33, higher melting solder layers 34) is performed, and thereafter bonding by solder having a relatively low melting temperature (lower melting solder layers 32) or the reflow process is performed. Thus, the solder having a relatively low melting temperature can be inhibited from being melted by heat for performing the bonding by solder having a relatively high melting temperature, dissimilarly to a case where the bonding by solder having a relatively high melting temperature is performed after the bonding by solder having a relatively low melting temperature or the reflow process is performed.

The second substrate 2 is so arranged with respect to the first substrate 1 that the protrusion lengths L2 (see FIG. 2) of the portions of the P-side connection terminal 5a and the N-side connection terminal 5b protruding toward the first substrate 1 from the inner surface of the case portion 4 are smaller than the length L1 from the outer peripheral end of the second substrate 2 to the outer peripheral end of the first substrate 1 in plan view (in the direction X-Y) when the first substrate 1 located on the lower side and the second substrate 2 located on the upper side are opposed to each other.

Figure 14:
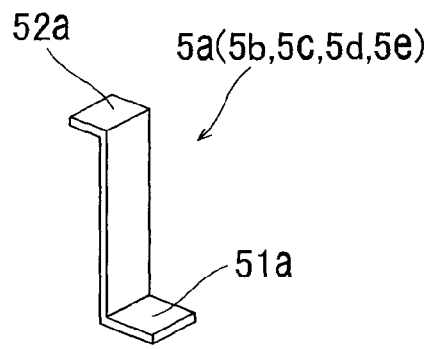
FIG. 14 is a diagram for illustrating a step of forming a P-side (N-side, U-phase, V-phase, W-phase) connection terminal of the power module according to the first embodiment of the present invention.
Figure 15:
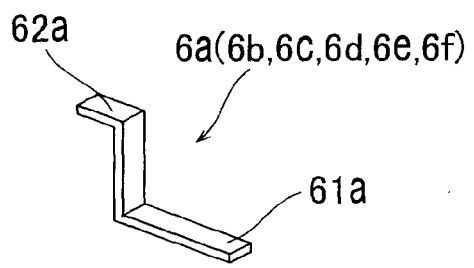
FIG. 15 is a diagram for illustrating a step of forming a gate connection terminal of the power module according to the first embodiment of the present invention.
Figure 16:
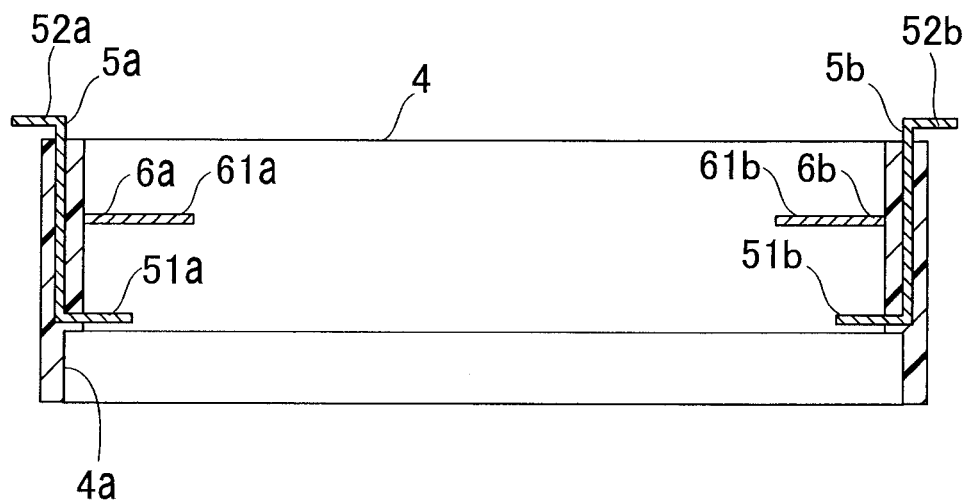
FIG. 16 is a diagram for illustrating a step of forming a case portion of the power module according to the first embodiment of the present invention.

Then, the case portion 4 (see FIG. 16) made of resin in which the metallic P-side connection terminal 5a, the metallic N-side connection terminal 5b, the metallic U-phase connection terminal 5c, the metallic V-phase connection terminal 5d, and the metallic W-phase connection terminal 5e previously bent automatically by press working or the like shown in FIG. 14 and the metallic gate connection terminals 6a to 6f previously bent automatically by press working or the like shown in FIG. 15 are embedded by insert resin molding, for example is prepared. A coating film of a Ni/Au layer may be formed on the surface of each connection terminal by plating before or after the P-side connection terminal 5a, the N-side connection terminal 5b, the U-phase connection terminal 5c, the V-phase connection terminal 5d, the W-phase connection terminal Se, and the gate connection terminals 6a to 6f are bent.

Figure 17:
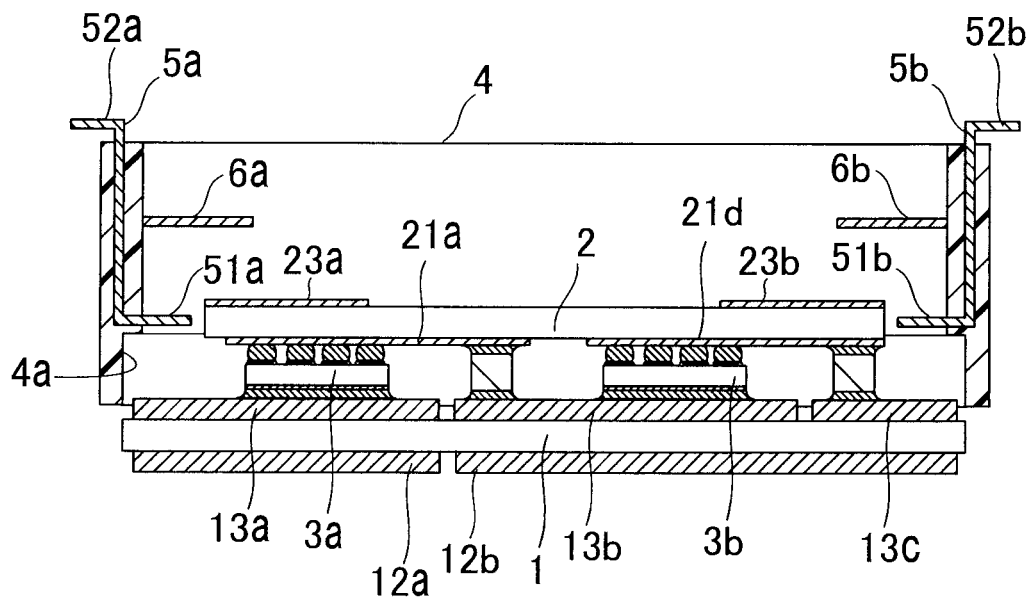
FIG. 17 is a diagram for illustrating a step of inserting the first substrate and the second substrate into the case portion of the power module according to the first embodiment of the present invention.

As shown in FIG. 17, the first substrate 1 and the second substrate 2 are inserted into the case portion 4 while the same are opposed to each other. As described above, the second substrate 2 is smaller than the first substrate 1. Furthermore, the protrusion lengths L2 (see FIG. 2) of the portions of the P-side connection terminal 5a and the N-side connection terminal 5b protruding toward the first substrate 1 from the inner surface of the case portion 4 are smaller than the length L1 from the outer edge (outer peripheral end) of the second substrate 2 to the outer edge (outer peripheral end) of the first substrate 1. Thus, the second substrate 2 is inserted into the case portion 4 without interfering with the P-side connection terminal 5a and the N-side connection terminal 5b (U-phase connection terminal 5c, V-phase connection terminal 5d, and W-phase connection terminal 5e). As shown in FIG. 3, the conductive patterns 13a to 13e of the first substrate 1 come into contact with the positioning portion 4a located on the lower portion of the case portion 4 to position the first substrate 1. Thereafter, the P-side connection terminal 5a, the N-side connection terminal 5b, the U-phase connection terminal 5c, the V-phase connection terminal 5d, and the W-phase connection terminal 5e are connected to the conductive patterns 13a, 13c, 13b, 13d, and 13e, respectively, by solder layers 31. The gate connection terminals 6a to 6f are connected to the conductive patterns 23a to 23f, respectively, by solder layers 31. A reflow process may be performed using solder sheets in place of the solder layers 31 to connect the connection terminals to the conductive patterns at once.

Finally, the sealing member 7 is filled into the case portion 4 to cover the first substrate 1, the second substrate 2, and the MOSFETs 3a to 3f and expose the second end 52a of the P-side connection terminal 5a (N-side connection terminal 5b, U-phase connection terminal 5c, V-phase connection terminal 5d, W-phase connection terminal 5e) and the second end 62a of the gate connection terminal 6a (gate connection terminals 6b to 6f). Thus, the power module 100 is completed.

According to the first embodiment, as hereinabove described, the case portion 4 includes the P-side connection terminal 5a (N-side connection terminal 5b, U-phase connection terminal 5c, V-phase connection terminal 5d, W-phase connection terminal 5e) connected to the first substrate 1 and the gate connection terminals 6a to 6f connected to the second substrate 2. Thus, the p-side connection terminal 5a (N-side connection terminal 5b, U-phase connection terminal 5c, V-phase connection terminal 5d, W-phase connection terminal 5e) and the gate connection terminals 6a to 6f can be electrically connected to the MOSFETs 3a to 3f without using bonding wires extending in a horizontal direction, for example. Consequently, spaces occupied by bonding wires can be reduced, and hence the power module 100 can be miniaturized.

Furthermore, the sectional area of wiring can be increased while the length of wiring can be decreased as compared with a case of making an electrical connection through a bonding wire extending in the horizontal direction. Thus, the resistance and the inductance of each connection terminal can be reduced. Consequently, the low-loss power module 100 can be formed.

According to the first embodiment, as hereinabove described, the second substrate 2 is formed to be smaller than the first substrate 1 in order to be capable of penetrating without interfering with the P-side connection terminal 5a (N-side connection terminal 5b, U-phase connection terminal 5c, V-phase connection terminal 5d, W-phase connection terminal 5e) protruding toward the first substrate 1 from the inner surface of the case portion 4 when the first substrate 1 and the second substrate 2 are inserted into the case portion 4. Thus, the P-side connection terminal 5a (N-side connection terminal 5b, U-phase connection terminal 5c, V-phase connection terminal 5d, W-phase connection terminal 5e) and the second substrate 2 can be avoided from interfering with each other, and hence the second substrate 2 can be easily arranged in the case portion 4.

According to the first embodiment, as hereinabove described, the P-side connection terminal 5a (N-side connection terminal 5b, U-phase connection terminal 5c, V-phase connection terminal 5d, W-phase connection terminal 5e) is prevented from intruding into the region where the first substrate 1 and the second substrate 2 are opposed to each other when the MOSFETs are mounted between the first substrate 1 and the second substrate 2. In other words, the protrusion length L2 of the portion of the P-side connection terminal 5a (N-side connection terminal 5b, U-phase connection terminal 5c, V-phase connection terminal 5d, W-phase connection terminal 5e) protruding toward the first substrate 1 from the inner surface of the case portion 4 is smaller than the length L1 from the outer peripheral end of the second substrate 2 to the outer peripheral end of the first substrate 1 (inner surface of the case portion 4). Thus, the P-side connection terminal 5a (N-side connection terminal 5b, U-phase connection terminal 5c, V-phase connection terminal 5d, W-phase connection terminal 5e) and the second substrate 2 can be avoided from interfering with each other.

According to the first embodiment, as hereinabove described, the power module 100 is so formed that the protrusion length L2 of the portion of the P-side connection terminal 5a (N-side connection terminal 5b, U-phase connection terminal 5c, V-phase connection terminal 5d, W-phase connection terminal 5e) protruding toward the first substrate 1 from the inner surface of the case portion 4 is smaller than the protrusion lengths L3 of the portions of the gate connection terminals 6a to 6f protruding toward the second substrate 2 from the inner surface of the case portion 4. Thus, the second substrate 2 can be inserted into the case portion 4 without interfering with the P-side connection terminal 5a (N-side connection terminal 5b, U-phase connection terminal 5c, V-phase connection terminal 5d, W-phase connection terminal 5e). Furthermore, the second substrate 2 and the gate connection terminals 6a to 6f can come into contact with each other when the second substrate 2 is inserted into the case portion 4.

According to the first embodiment, as hereinabove described, the power module 100 is so formed that the difference L4 between the vertical position of the first end 51a of the P-side connection terminal 5a (N-side connection terminal 5b, U-phase connection terminal 5c, V-phase connection terminal 5d, W-phase connection terminal 5e) in the case portion 4 and the vertical position of the first end 61a of the gate connection terminal 6a (gate connection terminals 6b to 6f) in the case portion 4 is substantially equal to the difference L5 between the vertical position of the portion of the first substrate 1 connected with the P-side connection terminal 5a (N-side connection terminal 5b, U-phase connection terminal 5c, V-phase connection terminal 5d, W-phase connection terminal 5e) in the case portion 4 and the vertical positions of the portions of the second substrate 2 connected with the gate connection terminals 6a to 6f in the case portion 4. Thus, the gate connection terminals 6a to 6f and the second substrate 2 (conductive patterns 23a to 23f) also come into contact with each other when the P-side connection terminal 5a (N-side connection terminal 5b, U-phase connection terminal 5c, V-phase connection terminal 5d, W-phase connection terminal 5e) and the first substrate 1 (conductive patterns 13a to 13e) come into contact with each other. In other words, bonding can be performed at once, and hence bonding by solder can be facilitated to greatly reduce the time required for the bonding.

According to the first embodiment, as hereinabove described, the power module 100 is so formed that the vertical position of the second end 52a of the P-side connection terminal 5a (N-side connection terminal 5b, U-phase connection terminal 5c, V-phase connection terminal 5d, W-phase connection terminal 5e) and the vertical position of the second end 62a of the gate connection terminal 6a (gate connection terminals 6b to 6f) are substantially equal to each other. Thus, the second end 52a of the P-side connection terminal 5a (N-side connection terminal 5b, U-phase connection terminal 5c, V-phase connection terminal 5d, W-phase connection terminal 5e) and the second end 62a of the gate connection terminal 6a (gate connection terminals 6b to 6f) can be easily connected to an external device (substrate connected with a calculation device or an electrically-powered device, for example).

According to the first embodiment, as hereinabove described, the gate connection terminals 6a to 6f are electrically connected to the gates (G) of the MOSFETs 3a to 3f through the conductive patterns 23a to 23f of the second substrate 2, respectively. Thus, no bonding wire extending in the horizontal direction is provided so that the power module 100 can be miniaturized, dissimilarly to a case where the gate connection terminals 6a to 6f are electrically connected to the gates (G) of the MOSFETs 3a to 3f through bonding wires extending in the horizontal direction.

According to the first embodiment, as hereinabove described, the outer edge (conductive patterns 13a to 13e) of the first substrate 1 comes into contact with the lower portion (end surface) of the case portion 4 when the first substrate 1 and the second substrate 2 are arranged in the case portion 4, so that the positioning portion 4a to position the first substrate 1 is provided. Thus, the first substrate 1 can be easily positioned.

According to the first embodiment, as hereinabove described, the power module 100 is so formed that the sectional areas of the P-side connection terminal 5a, the N-side connection terminal 5b, the U-phase connection terminal 5c, the V-phase connection terminal 5d, and the W-phase connection terminal 5e are larger than the sectional areas of the gate connection terminals 6a to 6f. Thus, principal currents to drive the motor that are larger than currents of control signals can flow in the P-side connection terminal 5a, the N-side connection terminal 5b, the U-phase connection terminal 5c, the V-phase connection terminal 5d, and the W-phase connection terminal 5e.

According to the first embodiment, as hereinabove described, the sealing member 7 having insulating properties is filled into the case portion 4 to cover the first substrate 1, the second substrate 2, and the MOSFETs 3a to 3f and expose the second end 52a of the P-side connection terminal 5a (N-side connection terminal 5b, U-phase connection terminal 5c, V-phase connection terminal 5d, W-phase connection terminal 5e) and the second end 62a of the gate connection terminal 6a (gate connection terminals 6b to 6f). Thus, short circuits between the MOSFETs 3a to 3f and short circuits between the connection terminals can be inhibited so that the reliability of the power module 100 is improved.

According to the first embodiment, as hereinabove described, the portions 131a to 131e of the P-side connection terminal 5a, the N-side connection terminal 5b, the U-phase connection terminal 5c, the V-phase connection terminal 5d, and the W-phase connection terminal 5e connected to the first substrate 1 and the portions 231a to 231f of the gate connection terminals 6a to 6f connected to the second substrate 2 are provided in the vicinity of the ends (edges) of the first substrate 1 and the second substrate 2. Thus, the lengths of the P-side connection terminal 5a, the N-side connection terminal 5b, the U-phase connection terminal 5c, the V-phase connection terminal 5d, the W-phase connection terminal 5e, and the gate connection terminals 6a to 6f can be reduced, and hence the resistance and the inductance of each connection terminal can be reduced. Consequently, the low-loss power module 100 can be formed.

According to the first embodiment, as hereinabove described, the power module 100 includes the radiator plate 12a provided in a region corresponding to the MOSFETs 3a, 3c, and 3e on the side opposite to the MOSFETs 3a to 3f of the first substrate 1 and the radiator plates 12b, 12c, and 12d provided in regions corresponding to the MOSFETs 3b, 3d, and 3f on the side opposite to the MOSFETs 3a to 3f of the first substrate 1. Thus, heat generated by the MOSFETs 3a to 3f can be efficiently radiated by the radiator plates 12a to 12d to improve radiation performance.

(Second Embodiment)

Figure 18:
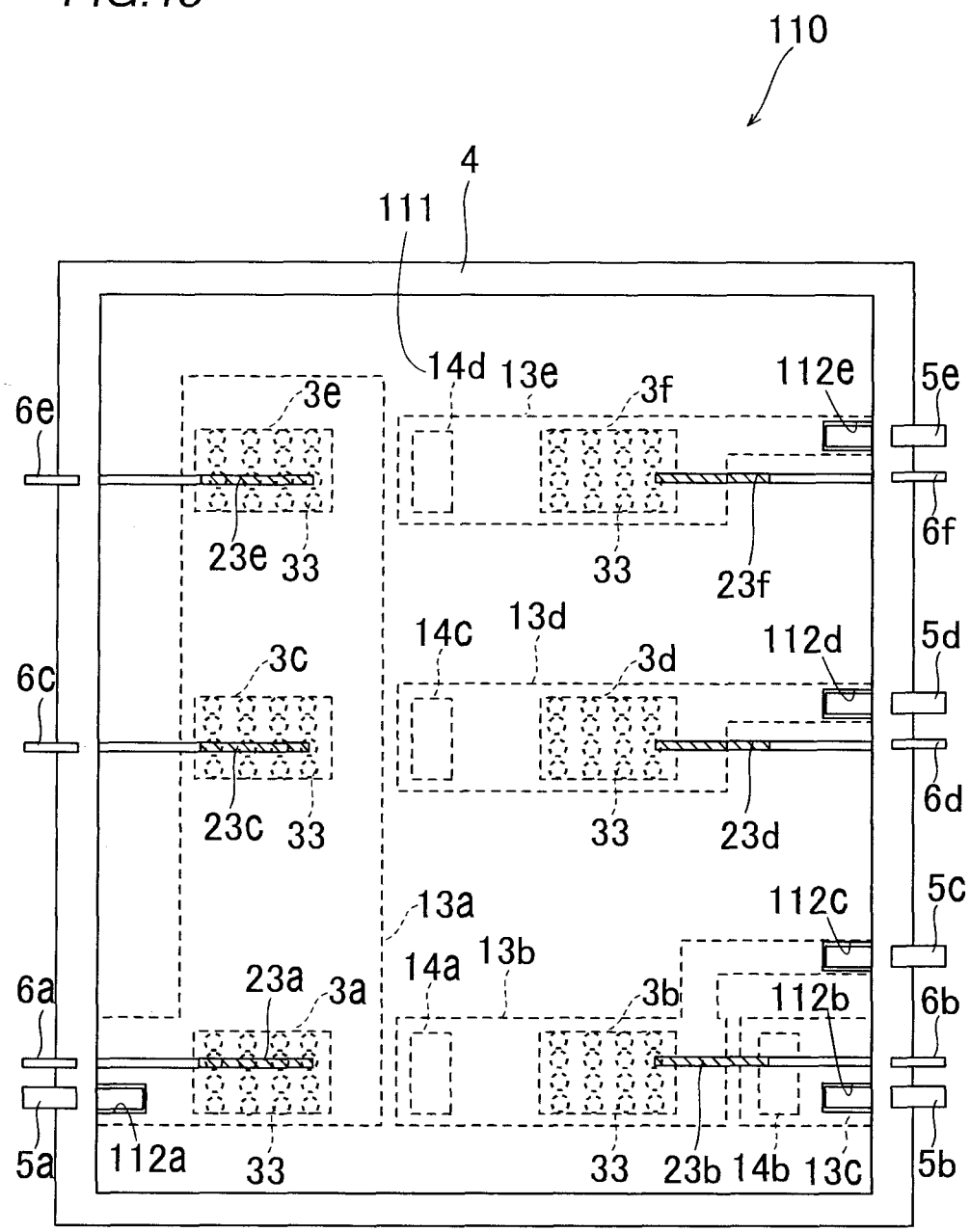
FIG. 18 is a plan view of a power module according to a second embodiment of the present invention.

A power module 110 according to a second embodiment is now described with reference to FIGS. 18 and 19. According to this second embodiment, notches 112a to 112e are provided on a second substrate 111, dissimilarly to the first embodiment in which the aforementioned second substrate 2 is smaller than the first substrate 1. The power module 110 is an example of the "power converter" and the "semiconductor device" in the present invention.

Figure 19:
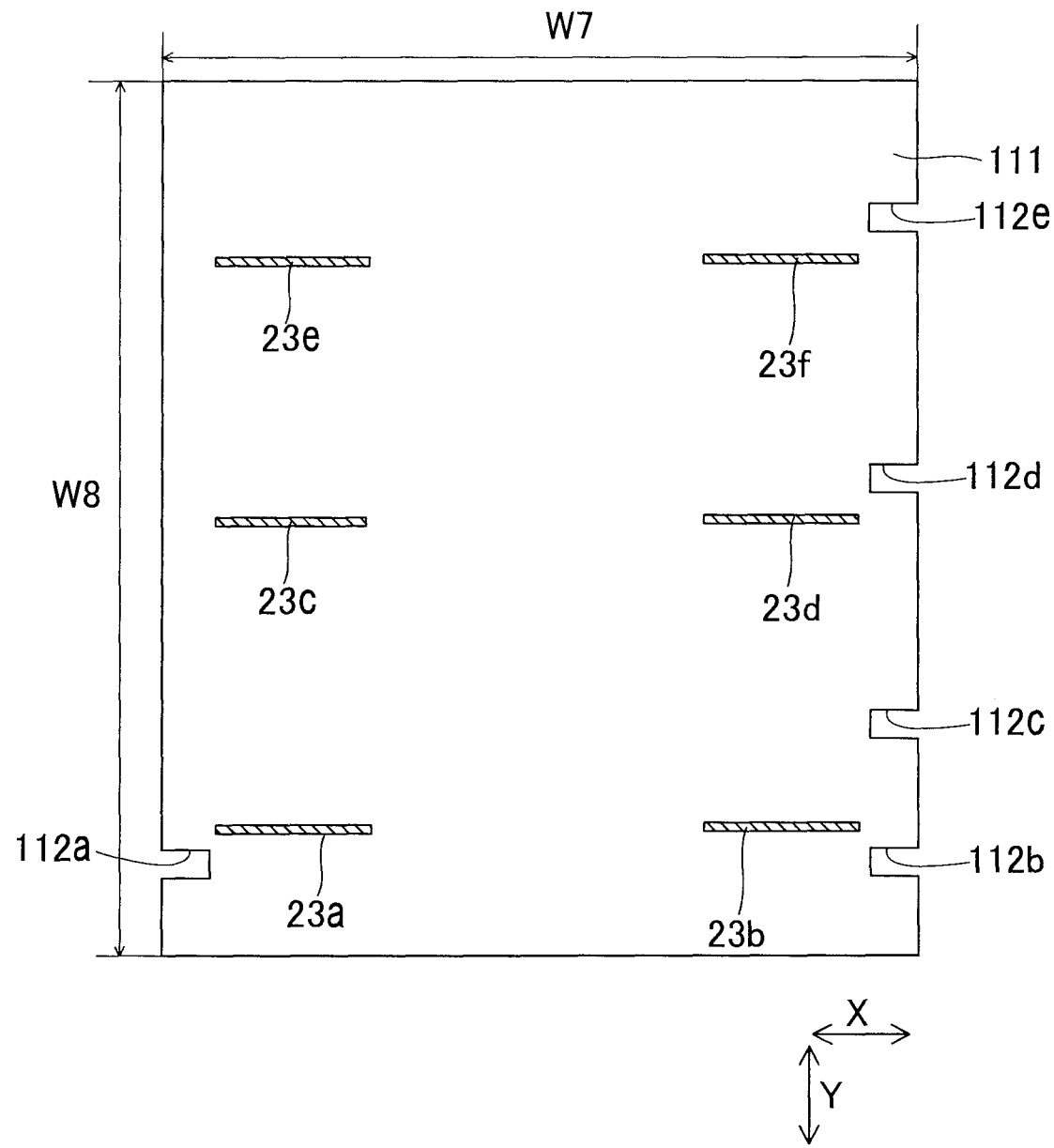
FIG. 19 is a top plan view of a second substrate of the power module according to the second embodiment of the present invention.

As shown in FIG. 19, the power module 110 according to the second embodiment is so formed that the width W7 of the second substrate 111 in a direction X and the width W8 of the second substrate 111 in a direction Y are substantially equal to the width W3 of the first substrate 1 (see FIG. 5) in the direction X and the width W4 of the first substrate 1 in the direction Y, respectively. As shown in FIGS. 18 and 19, the notches 112a, 112b, 112c, 112d, and 112e are formed on edges of the second substrate 111. The notches 112a to 112e are formed in such a size that the second substrate 111 can pass through the inside of the case portion 4 without interfering with the P-side connection terminal 5a, the N-side connection terminal 5b, the U-phase connection terminal 5c, the V-phase connection terminal 5d, and the W-phase connection terminal 5e when the first substrate 1 and the second substrate 111 are inserted into the case portion 4. The remaining structure of the power module 110 according to the second embodiment is similar to that of the power module 100 according to the aforementioned first embodiment.

According to the second embodiment, as hereinabove described, the notches 112a to 112e are so formed on the second substrate 111 that the second substrate 111 can penetrate without interfering with the P-side connection terminal 5a, the N-side connection terminal 5b, the U-phase connection terminal 5c, the V-phase connection terminal 5d, and the W-phase connection terminal 5e. Consequently, the second substrate 111 can be inhibited from interfering with the P-side connection terminal 5a, the N-side connection terminal 5b, the U-phase connection terminal 5c, the V-phase connection terminal 5d, and the W-phase connection terminal 5e, and hence the second substrate 111 can be easily arranged in the case portion 4. The remaining effects of the second embodiment are similar to those of the aforementioned first embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while the n-type field effect transistor (MOSFET) is employed as the power conversion element in the present invention in each of the aforementioned first and second embodiments, the present invention is not restricted to this. In the present invention, a p-type field effect transistor, an IGBT, a diode, etc. may alternatively be employed as the power conversion element.

While the P-side connection terminal, the N-side connection terminal, the U-phase connection terminal, the V-phase connection terminal, and the W-phase connection terminal are connected to the first substrate while the gate connection terminals are connected to the second substrate in each of the aforementioned first and second embodiments, the present invention is not restricted to this. For example, the P-side connection terminal, the N-side connection terminal, the U-phase connection terminal, the V-phase connection terminal, and the W-phase connection terminal may alternatively be connected to the second substrate while the gate connection terminals may alternatively be connected to the first substrate.

While the P-side connection terminal, the N-side connection terminal, the U-phase connection terminal, the V-phase connection terminal, and the W-phase connection terminal each supplying principal currents and the gate connection terminals each supplying control signals are bent toward the outer periphery of the case portion in each of the aforementioned first and second embodiments, the present invention is not restricted to this. For example, the connection terminals supplying principal currents and the gate connection terminals supplying control signals may alternatively be bent toward the inner periphery of the case portion.

While the portions of the P-side connection terminal, the N-side connection terminal, the U-phase connection terminal, the V-phase connection terminal, the W-phase connection terminal, and the gate connection terminals other than the first ends and the second ends are embedded in the case portion in each of the aforementioned first and second embodiments, the present invention is not restricted to this. For example, the portions of the connection terminals other than the first ends and the second ends may alternatively be bonded onto the inner surface of the case portion.

While the positioning portion is provided on the lower surface of the case portion to position the first substrate in each of the aforementioned first and second embodiments, the present invention is not restricted to this. For example, a boss-shaped positioning portion protruding from the inner surface of the case portion may alternatively be provided to position the first substrate.

What is claimed is:

1. A power converter comprising:
   a first substrate;
   a second substrate arranged to be opposed to said first substrate;
   a power conversion element mounted between said first substrate and said second substrate; and
   a case portion provided to surround said first substrate and said second substrate, wherein
   said case portion includes a first connection terminal connected to a first conductor pattern arranged on a side of said first substrate closer to said power conversion element and a second connection terminal connected to a second conductor pattern arranged on a surface of a first side of said second substrate opposite to a surface of a second side of said second substrate facing said power conversion element.

2. The power converter according to claim 1, wherein
   a first end of said first connection terminal of said case portion is so formed as to protrude toward said first substrate from an inner surface of said case portion, and
   said second substrate is formed in such a size or a shape that said second substrate can pass through an inside of said case portion without interfering with said first connection terminal in order to allow said first substrate and said second substrate mounted with said power conversion element to be inserted into said case portion from said second substrate and be attached to said case portion.

3. The power converter according to claim 2, wherein
   said second substrate is formed to be smaller than said first substrate.

4. The power converter according to claim 3, wherein
   a protrusion length of a portion of said first connection terminal protruding toward said first substrate from said inner surface of said case portion is smaller than a length from an outer peripheral end of said second substrate to said inner surface of said case portion not to intrude into a region where said first substrate and said second substrate are opposed to each other.

5. The power converter according to claim 3, wherein
   a first end of said second connection terminal of said case portion is so formed as to protrude toward said second substrate from said inner surface of said case portion, and
   a protrusion length of a portion of said first connection terminal protruding toward said first substrate from said inner surface of said case portion is smaller than a protrusion length of a portion of said second connection terminal protruding toward said second substrate from said inner surface of said case portion.

6. The power converter according to claim 2, wherein
   said second substrate is formed with a notch on an edge thereof to be capable of passing through said inside of said case portion without interfering with said first connection terminal.

7. The power converter according to claim 1, wherein
   a first end of said first connection terminal of said case portion is so formed as to protrude toward said first substrate from an inner surface of said case portion while a first end of said second connection terminal of said case portion is so formed as to protrude toward said second substrate from said inner surface of said case portion, and
   a difference between a vertical position of said first end of said first connection terminal of said case portion and a vertical position of said first end of said second connection terminal of said case portion is substantially equal to a difference between a vertical position of a connection portion of said first conductor pattern and a vertical position of a connection portion of said second conductor pattern so that said first end of said first connection terminal of said case portion comes into contact with said connection portion of said first conductor pattern arranged on said side of said first substrate closer to said power conversion element while said first end of said second connection terminal of said case portion comes into contact with said connection portion of said second conductor pattern arranged on said first side of said second substrate opposite to said power conversion element.

8. A power converter according to claim 1 comprising:
   a first substrate;
   a second substrate arranged to be opposed to said first substrate;
   a power conversion element mounted between said first substrate and said second substrate; and
   a case portion provided to surround said first substrate and said second substrate, wherein
   said case portion includes a first connection terminal connected to a first conductor pattern arranged on a side of said first substrate closer to said power conversion element and a second connection terminal connected to a second conductor pattern arranged on a side of said second substrate opposite to said power conversion element, wherein
   second ends of said first connection terminal and said second connection terminal of said case portion are extracted from a first end surface of said case portion, and are bent toward an outer periphery or an inner periphery of said case portion such that vertical positions of said second ends of said first connection terminal and said second connection terminal are substantially equal to each other.

9. A power converter comprising:
a first substrate;
a second substrate arranged to be opposed to said first substrate;
a power conversion element mounted between said first substrate and said second substrate; and
a case portion provided to surround said first substrate and said second substrate, wherein
said case portion includes a first connection terminal connected to a first conductor pattern arranged on a side of said first substrate closer to said power conversion element and a second connection terminal connected to a second conductor pattern arranged on a side of said second substrate opposite to said power conversion element, wherein
said second conductor pattern arranged on said side of said second substrate opposite to said power conversion element is electrically connected to said power conversion element.

10. The power converter according to claim 1, wherein
a positioning portion to position said first substrate when an outer edge of said first substrate comes into contact with said positioning portion is provided on a second end surface of said case portion.

11. The power converter according to claim 1, wherein
said first connection terminal supplies at least either principal currents or control signals while said second connection terminal supplies control signals, and
a sectional area of said first connection terminal supplying principal currents is larger than a sectional area of said second connection terminal.

12. The power converter according to claim 1, further comprising a sealing member having insulating properties, filled into said case portion to cover said first substrate, said second substrate, and said power conversion element and expose second ends of said first connection terminal and said second connection terminal.

13. The power converter according to claim 1, wherein
a connection portion of said first conductor pattern connected to said first connection terminal and a connection portion of said second conductor pattern connected to said second connection terminal are provided on edges of said first substrate and said second substrate, respectively.

14. The power converter according to claim 1, wherein
a radiator plate is provided on a surface of said first substrate opposite to a surface on which said power conversion element is set.

15. The power converter according to claim 14, wherein
said power conversion element includes a first power conversion element and a second power conversion element, and
said radiator plate includes a first radiator plate and a second radiator plate provided separately from each other on regions where said first power conversion element and said second power conversion element are set.

16. A semiconductor device comprising:
a first substrate;
a second substrate arranged to be opposed to said first substrate;
a power conversion element mounted between said first substrate and said second substrate; and
a case portion provided to surround said first substrate and said second substrate, wherein said case portion includes a first connection terminal connected to a first conductor pattern arranged on a side of said first substrate closer to said power conversion element and a second connection terminal connected to a second conductor pattern arranged on a surface of a first side of said second substrate opposite to a surface of a second side of said second substrate facing said power conversion element.

17. The semiconductor device according to claim 16, wherein
a first end of said first connection terminal of said case portion is so formed as to protrude toward said first substrate from an inner surface of said case portion, and
said second substrate is formed in such a size or a shape that said second substrate can pass through an inside of said case portion without interfering with said first connection terminal in order to allow said first substrate and said second substrate mounted with said power conversion element to be inserted into said case portion from said second substrate and be attached to said case portion.

18. The semiconductor device according to claim 17, wherein
said second substrate is formed to be smaller than said first substrate.

19. The semiconductor device according to claim 18, wherein
a protrusion length of a portion of said first connection terminal protruding toward said first substrate from said inner surface of said case portion is smaller than a length from an outer peripheral end of said second substrate to said inner surface of said case portion not to intrude into a region where said first substrate and said second substrate are opposed to each other.

20. A method for manufacturing a power converter, comprising:
mounting a power conversion element between a first substrate and a second substrate;
inserting said first substrate and said second substrate mounted with said power conversion element into a case portion from said second substrate and attaching said first substrate and said second substrate to said case portion;
bonding a first connection terminal that said case portion has and a connection portion of a first conductor pattern arranged on said first substrate to each other; and
bonding a second connection terminal that said case portion has and a connection portion of a second conductor pattern arranged on a surface of a first side of said second substrate opposite to a surface of a second side of said second substrate facing said power conversion element.

* * * * *